United States Patent
Hassell, Jr. et al.

(10) Patent No.: US 10,374,546 B2
(45) Date of Patent: Aug. 6, 2019

(54) MAINTAINING A SOLAR POWER MODULE

(71) Applicant: Saudi Arabian Oil Company, Dhahran (SA)

(72) Inventors: James Clyde Hassell, Jr., Dhahran (SA); Luiz Gustavo DoVal, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 15/397,190

(22) Filed: Jan. 3, 2017

(65) Prior Publication Data
US 2018/0191291 A1    Jul. 5, 2018

(51) Int. Cl.
| | |
|---|---|
| *H02S 40/10* | (2014.01) |
| *H02S 30/10* | (2014.01) |
| *B08B 3/04* | (2006.01) |
| *B08B 3/14* | (2006.01) |
| *B08B 3/08* | (2006.01) |
| *F24S 40/10* | (2018.01) |
| *F24S 23/72* | (2018.01) |
| *F24S 10/50* | (2018.01) |
| *F24S 70/60* | (2018.01) |
| *F24S 20/00* | (2018.01) |

(52) U.S. Cl.
CPC ............ *H02S 40/10* (2014.12); *B08B 3/042* (2013.01); *B08B 3/08* (2013.01); *B08B 3/14* (2013.01); *F24S 10/505* (2018.05); *F24S 23/72* (2018.05); *F24S 40/10* (2018.05); *F24S 70/60* (2018.05); *H02S 30/10* (2014.12); *F24S 2020/17* (2018.05); *Y02E 10/44* (2013.01)

(58) Field of Classification Search
None
See application file for complete search history.

(56) References Cited

U.S. PATENT DOCUMENTS

| | | |
|---|---|---|
| 3,096,593 A | 7/1963 | Visser |
| 3,934,573 A | 1/1976 | Dandini |
| 4,064,409 A | 12/1977 | Redman |

(Continued)

FOREIGN PATENT DOCUMENTS

| | | |
|---|---|---|
| DE | 102014006126 | 6/2015 |
| EP | 2647057 | 10/2013 |

(Continued)

OTHER PUBLICATIONS

International Search Report and Written Opinion in International Application No. PCT/US2017/067574 dated Feb. 28, 2018, 14 pages.

(Continued)

*Primary Examiner* — Michael E Barr
*Assistant Examiner* — Jason P Riggleman
(74) *Attorney, Agent, or Firm* — Fish & Richardson P.C.

(57) ABSTRACT

A solar power system includes a plurality of solar power cells mounted on a spherical frame; a hemispherical reservoir mounted to the spherical frame to enclose at least a portion of the spherical frame such that a gap is defined between the spherical frame and an interior surface of the reservoir, the reservoir configured to hold a fluid that includes a solar cell cleaning solution; and at least one actuator mounted to the spherical frame and operable to rotate a portion of the spherical frame that supports the plurality of solar power cells through the gap.

21 Claims, 8 Drawing Sheets

(56) References Cited

U.S. PATENT DOCUMENTS

| | | |
|---|---|---|
| 4,217,147 A | 8/1980 | Ziemba |
| 4,830,677 A | 5/1989 | Geisler, Jr. |
| 4,908,903 A | 3/1990 | Mori |
| 6,355,873 B1 | 3/2002 | Ishikawa |
| 6,762,359 B2 | 7/2004 | Asai et al. |
| 7,621,319 B2 | 11/2009 | Ouyang |
| 7,863,517 B1 | 1/2011 | DiDomenico |
| 8,013,238 B2 | 9/2011 | Hockaday |
| 8,240,320 B2 | 8/2012 | Mertins et al. |
| 8,344,238 B2 | 1/2013 | Gronet et al. |
| 8,955,351 B2 | 2/2015 | Kno et al. |
| 9,279,075 B2 | 3/2016 | Parker et al. |
| 2004/0056541 A1 | 3/2004 | Steinmeyer |
| 2005/0224343 A1 | 10/2005 | Newcomb et al. |
| 2006/0278263 A1 | 12/2006 | Kim |
| 2007/0028960 A1 | 2/2007 | Royne |
| 2007/0058340 A1 | 3/2007 | Ouyang |
| 2007/0089866 A1 | 4/2007 | Ouyang |
| 2008/0088135 A1 | 4/2008 | Vidal |
| 2009/0126795 A1 | 5/2009 | Williams |
| 2010/0071833 A1 | 3/2010 | Maiorino |
| 2010/0218817 A1 | 9/2010 | Guha et al. |
| 2010/0288333 A1 | 11/2010 | Temchenko et al. |
| 2010/0319680 A1 | 12/2010 | Kelly |
| 2011/0005565 A1 | 1/2011 | Flores |
| 2011/0146660 A1 | 6/2011 | Cho |
| 2011/0180238 A1 | 7/2011 | Vetrovec |
| 2012/0060896 A1 | 3/2012 | Schafer |
| 2012/0273164 A1 | 11/2012 | Vetrovec |
| 2014/0197355 A1 | 7/2014 | Ram et al. |
| 2016/0056316 A1 | 2/2016 | Clark |

FOREIGN PATENT DOCUMENTS

| | | | |
|---|---|---|---|
| FR | 2477271 | 9/1981 | |
| FR | 2477271 A1 * | 9/1981 | ............ F24S 23/72 |
| GB | 2525853 | 11/2015 | |
| JP | 2001168369 | 6/2001 | |
| JP | 2011181540 | 9/2011 | |
| WO | 2006128236 | 12/2006 | |
| WO | WO-2011102618 A2 * | 8/2011 | ............ H02S 20/30 |
| WO | 2016124338 | 8/2016 | |

OTHER PUBLICATIONS

Adinoyi et al., "Effect of Dust Accumulation on the Power Outputs of Solar Photovoltaic Modules," Renewable Energy, vol. 60, Dec. 2013; pp. 633-636.

Dubey et al., "Temperature Dependent Photovoltaic (PV) Efficiency and its effect of PV Production in the World—A Review," Energy Procedia, vol. 33, Jan. 2013; pp. 311-321.

Rosensweig, "Theory of an Improved Thermal Magnetic Generator," IEEE, Proceedings of the Institution of Electrical Engineers, vol. 114, No. 3, Mar. 1967; pp. 405-409.

Ravaud et al., "Mechanical Properties of a Ferrofluid Seal—Three Dimensional Analytical Study Based on the Columbian Model," Progress in Electromagnetics research B, vol. 13, Mar. 2009; pp. 385-407.

Georgii et al., "On the Interplay of Magnetic and Molecular Forces in Curie-Wiess Ferrofluid Models," Journal of statistical physics, vol. 93, No. 1-2, Oct. 1998; pp. 79-107.

Felderhof, "Efficiency of Magnetic Plane Wave Pumping of a Ferrofluid through a Planar Duct," Physics of Fluids, vol. 23, No. 9, Sep. 2011; 4 pages.

Garg et al., "Numerical Analysis of Different Magnet Shapes on Heat Transfer Application using Ferrofluid," Central Scientific Instruments Organization, Excerpt from the Proceedings of the 2015 COSMOL Conference in Pune, India; 5 pages.

Gul et al., "Heat Transfer in MHD Mixed Convection Flow of a Ferrofluid along a Vertical Channel," PLoS ONE, vol. 10, No. 11, Nov. 2015; 14 pages.

Sinha-Ray et al., "Nano-encapsulated Smart Tunable Phase Change Materials," Soft Matter, vol. 7, No. 19, Oct. 2011; 12 pages.

Chaudhary et al., "Self pumping magnetic cooling," Journal of Physics D: Applied Physics, vol. 50, Dec. 19, 2016, 8 pages.

Kitanovski et al., "Innovative ideas for future research on magnetocaloric technologies," International Journal of Refrigeration, Elsevier, vol. 33, No. 3, May 2010, 16 pages.

Ghadiri et al., "Experimental investigation of a PVT system performance using nano ferrofluids," Energy Conversion and Management, vol. 103, Oct. 2015, 9 pages.

International Search Report and Written Opinion in International Application No. PCT/US2017/067563 dated Mar. 27, 2018, 15 pages.

Innocent Nkurikiyimfura, et al., "Heat transfer enhancement by magnetic nanofluids—A review"; Renewable and Sustainable Energy Reviews, vol. 21, May 2013; pp. 548-561.

International Search Report and Written Opinion in International Application No. PCT/US2017/067572 dated Mar. 13, 2018, 14 pages.

* cited by examiner

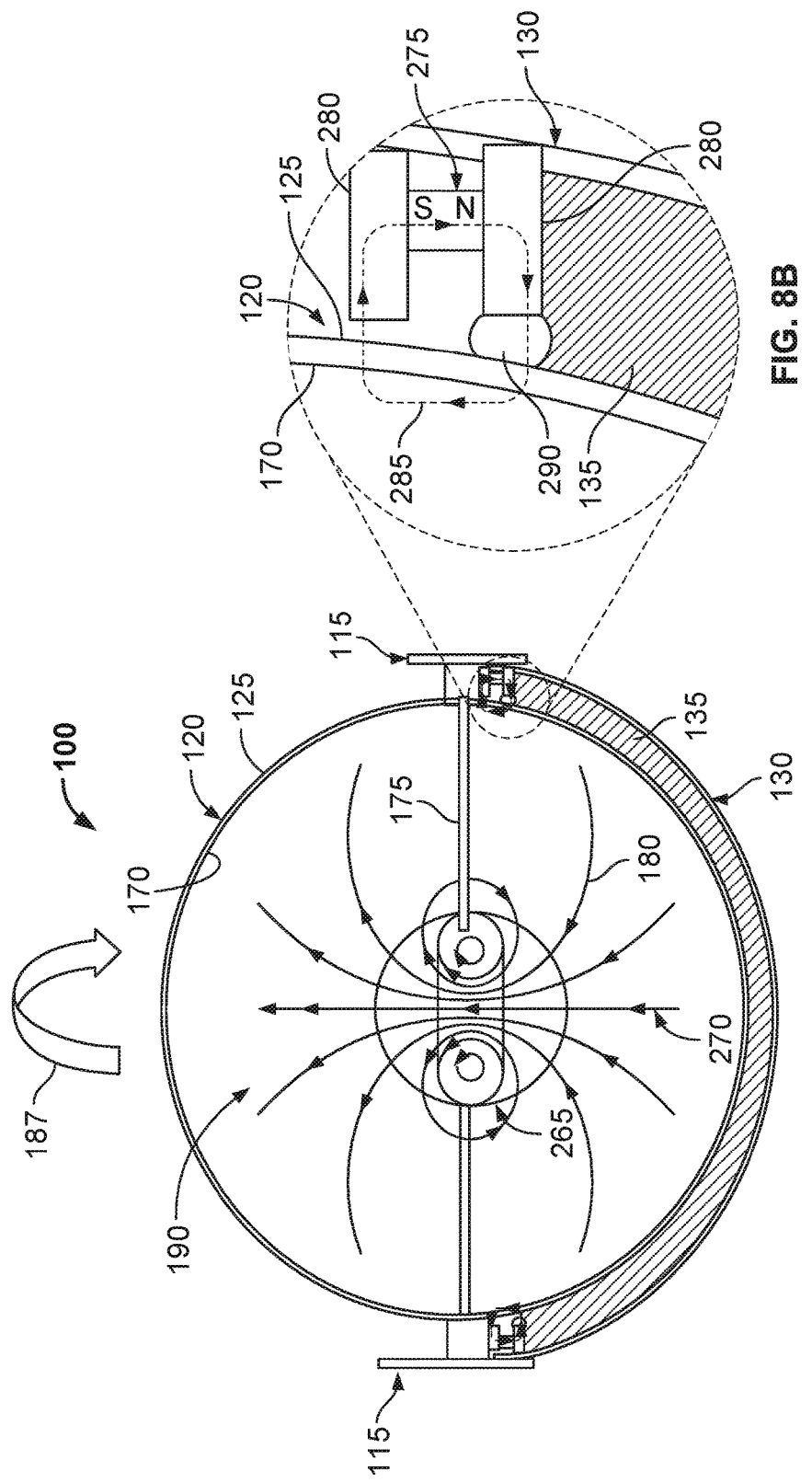

MAINTAINING A SOLAR POWER MODULE

TECHNICAL FIELD

This document relates to systems and methods for maintaining a solar power module and, more particularly, cleaning and cooling surfaces of a solar power module.

BACKGROUND

Solar power systems and modules, such as photovoltaic (PV) systems and heliostat systems, operate most efficiently in climates and ambient environments that experience a large number of sunny, daytime hours. In such climates and ambient environments, however, the large number of sunny hours can produce conditions that are not optimal for solar power system operation. For example, many locations around the Earth that experience sunny climates also experience high daytime temperatures coincident with the sunny hours. Further, many sunny climates are in locations in which sand, dust, and other particles are prevalent in the ambient atmosphere. Climate conditions such as high temperature and atmospheric particles can add challenges to efficient operation of solar power systems, such as PV cells used in solar panel arrays. For example, while sunny weather increases power output from the solar power arrays, dust and high temperature reduce the efficiency leading to lower solar power output.

SUMMARY

In a general implementation, a solar power system includes a plurality of solar power cells mounted on a spherical frame; a hemispherical reservoir mounted to the spherical frame to enclose at least a portion of the spherical frame such that a gap is defined between the spherical frame and an interior surface of the reservoir, the reservoir configured to hold a fluid that includes a solar cell cleaning solution; and at least one actuator mounted to the spherical frame and operable to rotate a portion of the spherical frame that supports the plurality of solar power cells through the gap.

In an aspect combinable with the general implementation, the plurality of solar power cells include a plurality of photovoltaic (PV) cells.

In another aspect combinable with any of the previous aspects, the at least one actuator includes at least one motor mounted to the spherical frame.

In another aspect combinable with any of the previous aspects, the actuator is mounted to the spherical frame at an axis of rotation of the spherical frame that extends through a geometric center of the spherical frame.

In another aspect combinable with any of the previous aspects, the plurality of solar power cells are mounted on an upper hemispherical portion of the spherical frame.

In another aspect combinable with any of the previous aspects, the hemispherical reservoir is mounted to the spherical frame to enclose a lower hemispherical portion of the spherical frame.

Another aspect combinable with any of the previous aspects further includes another plurality of solar power cells mounted to the lower hemispherical portion of the spherical frame.

Another aspect combinable with any of the previous aspects further includes an input conduit fluidly coupled between the reservoir and a source of the solar cell cleaning solution; and an output conduit fluidly coupled between the reservoir and a solar cell cleaning solution waste tank.

In another aspect combinable with any of the previous aspects, the output conduit includes a filter.

Another aspect combinable with any of the previous aspects further includes a seal mounted to at least one of the spherical frame or the reservoir.

In another aspect combinable with any of the previous aspects, the seal is positioned in fluidly-sealing contact with a top surface of the reservoir and at least a portion of the plurality of solar power cells.

In another aspect combinable with any of the previous aspects, the seal includes a flexible ring mounted along a circumference of the top surface of the reservoir.

In another general implementation, a method for cleaning a solar power system includes operating a solar power system that includes a plurality of solar power cells mounted on a spherical frame; rotating the spherical frame to move the plurality of solar power cells into a volume of a hemispherical reservoir that is mounted to the spherical frame; rotating the spherical frame to move the plurality of solar power cells into a solar cell cleaning solution fluid enclosed within the volume of the hemispherical reservoir defined between an interior surface of the reservoir and the spherical frame; and removing, with the solar cell cleaning solution, a plurality of particulates attached to the plurality of solar power cells.

In an aspects combinable with the general implementation, the plurality of solar power cells include a plurality of photovoltaic (PV) cells.

Another aspect combinable with any of the previous aspects further includes generating electrical power from the PV cells.

In another aspect combinable with any of the previous aspects, rotating the spherical frame includes rotating the spherical frame with at least one motor mounted to the spherical frame.

In another aspect combinable with any of the previous aspects, rotating the spherical frame includes rotating the spherical frame about an axis of rotation of the spherical frame that extends through a geometric center of the spherical frame.

In another aspect combinable with any of the previous aspects, the plurality of solar power cells are mounted on an upper hemispherical portion of the spherical frame, and the hemispherical reservoir is mounted to the spherical frame to enclose a lower hemispherical portion of the spherical frame.

In another aspect combinable with any of the previous aspects, rotating the spherical frame to move the plurality of solar power cells into the solar cell cleaning solution fluid enclosed within the volume of the hemispherical reservoir includes rotating the spherical frame to move another plurality of solar power cells mounted to the lower hemispherical portion of the spherical frame out of the solar cell cleaning solution.

Another aspect combinable with any of the previous aspects further includes flowing solar cell cleaning solution from a source of the solar cell cleaning solution to the volume of the reservoir; and flowing solar cell cleaning solution and at least a portion of the particulates from the reservoir to a solar cell cleaning solution waste tank.

Another aspect combinable with any of the previous aspects further includes filtering the portion of the particulates from the solar cell cleaning solution; and recirculating the filtered solar cell cleaning solution to the reservoir.

In another aspect combinable with any of the previous aspects, flowing solar cell cleaning solution from the source of the solar cell cleaning solution includes pumping the solar cell cleaning solution from the source of the solar cell cleaning solution.

Another aspect combinable with any of the previous aspects further includes sealing the solar cell cleaning solution within the volume of the reservoir.

Another aspect combinable with any of the previous aspects further includes cooling, with the solar cell cleaning solution, the plurality of solar power cells.

One, some, or all of the implementations according to the present disclosure may include one or more of the following features. For example, a solar power system according to the present disclosure may increase efficiency (for example, electrical power output) of a photovoltaic power system. A solar power system according to the present disclosure may facilitate in-situ cleaning of PV cells with little to no disassembly of the solar power system. As another example, multiple self-cleaning arrays of solar power systems can be linked easily in areas such as sun shades and car parks. Also, a solar power system according to the present disclosure may include a spherical design that provides 150% more surface area for the exposed hemispherical region for solar absorption than a planar solar panel. As another example, a solar panel cleaning system of a solar power system may also act as a heat transfer mechanism to reduce a surface temperature of a solar panel of the system. As another example, the cleaning system of a solar power system of the present disclosure may experience little to no evaporation of a cleaning solution, as well as little to no friction between the solar panel and the cleaning system, through a ferrofluid seal.

One, some, or all of the implementations according to the present disclosure may also include one or more of the following features. For example, a solar power system according to the present disclosure may also use a low or no energy magneto-caloric pump mechanism to circulate a cooling fluid to cool a solar panel of the power system. A solar power system according to the present disclosure may utilize permanent magnets to drive the magneto-caloric pump, which in turn may rotate a spherical solar panel of the system. A solar power system according to the present disclosure may also utilize a heat transfer material which requires no power to cool the solar panel of the power system. As another example, the solar power system may include cooling and cleaning systems that use little to no power and require little to no maintenance.

The details of one or more embodiments are set forth in the accompanying drawings and the description below. Other features, objects, and advantages will be apparent from the description and drawings, and from the claims.

DESCRIPTION OF DRAWINGS

FIG. 8A is a schematic illustration of at least a portion of a solar power system that includes at least one toroidal magnet and a magnetized fluid to cool the solar power system.

FIG. 8B is a schematic illustration of a magnetic fluid seal system that may be implemented with a solar power system that includes a solar panel cleaning assembly.

DETAILED DESCRIPTION

Figure 1A:
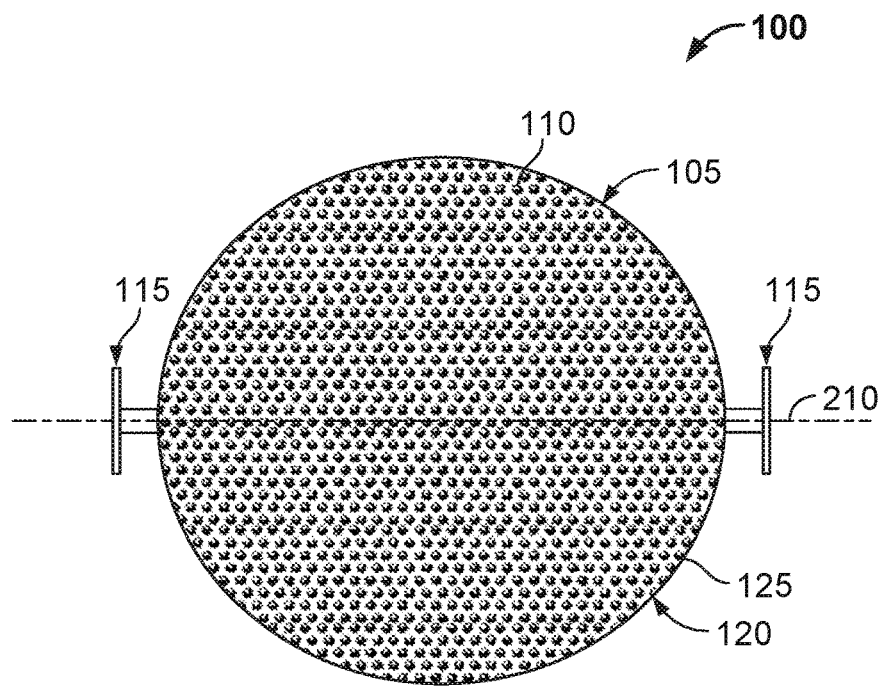
FIG. 1A is a schematic illustration of at least a portion of a solar power system.

FIG. 1A is a schematic illustration of at least a portion of a solar power system 100. FIG. 1A shows the solar power system 100 from a side view, where the solar power system 100 includes a solar panel 105. In this example embodiment, the solar panel 105 is spherically-shaped and mounted on mounting assemblies 115 along an axis (for example, an axis of rotation) 210. In alternative implementations, the solar panel 105 may be, for example, cylindrically-shaped, cubically-shaped, or other form that may be rotated about an axis. Other example shapes of the solar panel 105 include, for instance, cylinders with hemispherical ends, as well as cylinders with solar power cells (for example, photovoltaic cells) mounted on gears or spines that extend from a lateral surface of the cylinder. As another example, solar power cells may be mounted to fins or spines that extend from a shaft (rather than a cylinder).

Figure 5:
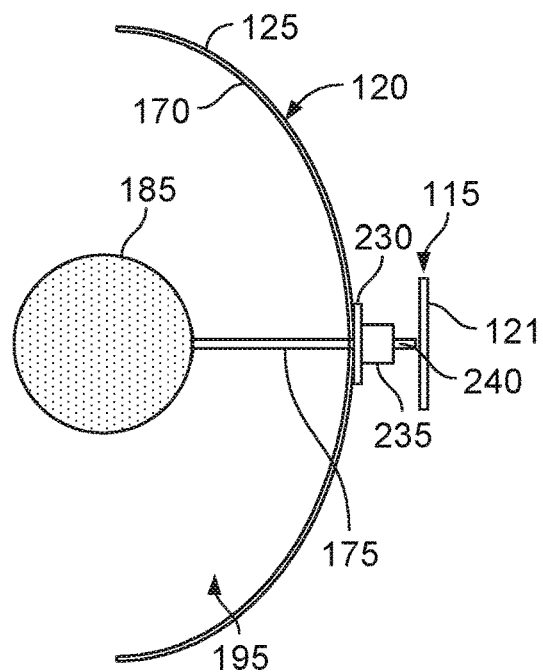
FIG. 5 is a schematic illustration of at least a portion of a solar power system that includes at least one magnet and a solar panel mounting assembly.

As shown in this example, the axis 215 extends through a diameter of the solar panel 105. Generally, the mounting assemblies 115 (for example, brackets, rotatable armatures, piston/cylinder assemblies, or otherwise) may facilitate installation of the solar power system 100 to a support structure (not shown), such as a roof, a terranean surface, a building structure, or other support structure. The solar power system 100 may be one of multiple solar power system 100 arranged in an array to generate electrical power from solar energy. Turning briefly to FIG. 5, this figure shows a schematic illustration of at least a portion of the solar power system 100 that includes at least one magnet 185 (described later) and a more detailed view of the solar panel mounting assembly 115. As shown in FIG. 5, the solar panel mounting assembly 115 includes a bracket 121 from which a shaft or coupling 240 extends into a bearing 235. The bearing 235, as shown receives the coupling 240 and a shaft 175 that extends through the spherical frame 120 at the axis 215. In some aspects, the shaft 175 and coupling 240 may be integral such that the coupling 240 is part of the shaft 175.

A spacer 230 (for example, that comprises bearing surfaces) is mounted to the shaft 175 between the outer surface 125 of the spherical frame 120 and the bearing 235. As shown, the solar panel mounting assembly 115 may provide for reduced friction rotation of the spherical frame 120 attached to the shaft 175, when the shaft 175 is actuated to turn.

Generally, the solar power system 100 receives solar energy from the Sun through multiple photovoltaic (PV) cells 110, and converts the received solar energy to direct current (DC) electricity. The solar energy consists of light energy (i.e., photons), from the Sun that can be transformed to electricity through the photovoltaic effect. Generally, each PV cell 110 absorbs the photons, which excites an electron residing on a semiconductor material to a higher-energy state. The excited electron (or electrons, as this process occurs for millions of electrons during operation of the PV cell 110) produces a voltage, which in turn can produce a DC through conduits (not shown) that are electrically coupled to the solar panel 105 (to the PV cells 110 in series). The DC carried in the conduits are delivered, typically, to an inverter system to convert the DC to alternating current (AC). Such electrical connections are made with the PV cells 110 in series to achieve an output voltage and a parallel desired current.

As shown in FIG. 1A, the solar panel 105 includes a spherical frame 120 with an outer surface 120 to which the PV cells 110 are mounted. In this example implementation, the spherical frame 120 may be solid or may be hollow. The spherical frame 120 is coupled to the mounting assemblies 115 to support the solar panel 105 and, in some aspects, allow rotational movement of the solar panel 105 about the axis 210.

Figure 1B:
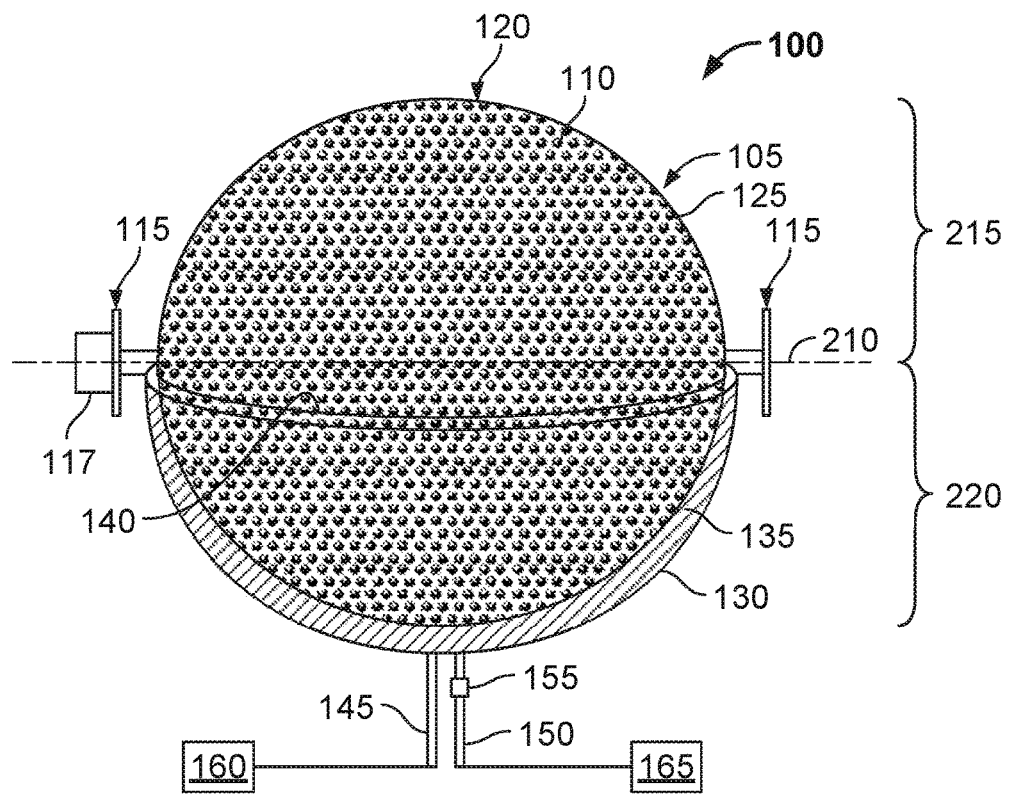
FIG. 1B is a schematic illustration of at least a portion of a solar power system that includes a solar panel cleaning assembly.

FIG. 1B is a schematic illustration of at least a portion of the solar power system 100 that includes a solar panel cleaning assembly. In this implementation, the solar panel cleaning system of the solar power system 100 includes, as shown, a reservoir 130 that surrounds a lower hemisphere 220 of the solar panel 105 and a cleaning solution 135 that is enclosed at least partially within the reservoir 130. Generally, the solar panel cleaning system in this example implementation may provide for automated cleaning of the solar panel 105, for example, to remove collected dust and other particles from the PV cells 110 by rotating the spherical frame 120 on the axis of rotation 210 to immerse an upper hemisphere 215 of the solar panel 105 within the cleaning solution 135 (for example, a cleaning liquid).

For example, in some aspects, deposits of dust and other particles on the surface of the PV cells 105 may block or partially block solar radiation from reaching the cells 110 (for example, through a glass cover on the cells 110). A density of deposited dust, as well as particle composition and particle distribution, can have an impact on the power output and current voltage and characteristics of the solar power system 100. For example, in certain Middle Eastern environments (for example, Dhahran, Saudi Arabia) the effect of dust accumulation on the power output of the PV cells 110 (for example, as mono-crystalline PV cells or polycrystalline PV cells) can gradually decrease power output if no cleaning is performed to remove the dust. In some cases, such deleterious effects can reduce power output by more than 50% with no cleaning. In some cases, even a single dust storm that deposits particles at on the PV cells 110 may decrease the power output by 20%.

The cleaning solution 135 may include one or more chemicals formulated to remove particles from the PV cells 110, prevent or help prevent mineralization buildup on the PV cells 110, or both. For example, in some aspects, commercial products such as Solar Panel Wash from American Polywater® Corp., NuRinse (several products) from NuGenTec®, Aquaease from Hubbard-Hall, or Solar Clean, Powerboost and Titan Glass Gleam Solar from J. Racenstein®. In some aspects, the cleaning solution 135 may be a water-based solution mixed with ethoxylated alcohols. In some aspects, the cleaning solution 135 may be a diluted soap-water mixture.

As further shown in FIG. 1B, an actuator 117 may be mounted to one or more of the mounting assemblies 115 to provide rotation of the spherical frame 120 so as to rotate the upper hemisphere 215 through the cleaning solution 135. For example, the actuator 117 may be coupled to a shaft (shown in other figures) that extends through or from the mounting assembly 115 and to or through the spherical frame 120. In some aspects, the actuator 117 may include or be a manual actuator, such as a handle or lever, thus allowing a human operator to rotate the spherical frame 120. In some aspects, the actuator 117 may include or be a motorized or automatic actuator, such as a hydraulic, electric, or solar powered motor, that can automatically (for example, upon receipt of a command from a control system, at a predetermined time, within prearranged time periods, or based on a density of particles on the PV cells 110) rotate the spherical frame 120.

Upon rotation (for example, by a manual or motorized actuator), the PV cells 110 mounted on the upper hemisphere 215 of the solar panel 105 may be immersed in the cleaning solution 135 within the reservoir 130. In some aspects, PV cells 110 may be mounted only on the upper hemisphere 215. Thus, in such aspects, the upper hemisphere 215 with the PV cells 110 may be rotated into the reservoir 130 to reside in the cleaning solution 135 for a particular time duration. As no PV cells may be mounted on the lower hemisphere 220, the solar power system 100 may not be operational (for example, produce DC) during this cleaning operation. Subsequently, the upper hemisphere 215 may be rotated out of the reservoir 130 to resume operation (for example, producing DC).

In some aspects, PV cells 110 may be mounted on the upper hemisphere 215 and the lower hemisphere 220 (for example, on the whole outer surface 125 of the spherical frame 120). Thus, in such aspects, the upper hemisphere 215 with the PV cells 110 may be rotated into the reservoir 130 to reside in the cleaning solution 135 to be cleaned, while the PV cells 110 mounted to the lower hemisphere 220 operate to produce DC. The solar power system 100 may remain in such a position for a time duration that may be longer than the particular time duration in the case of PV cells 110 only being mounted to the upper hemisphere 215. Subsequent to that longer duration, or when the PV cells 110 mounted on the lower hemisphere 220 are in need of cleaning, the upper hemisphere 215 may be rotated out of the reservoir 130 to continue of the solar power system 100 with little to no interruption of operation (for example, producing DC).

In some aspects, the cleaning solution 135 within the reservoir 130 may also provide a cooling fluid for the solar power system 100. For example, the PV cells 110 mounted to whichever hemisphere (for example, upper 215 or lower 220) of the solar panel 105 that is immersed in the reservoir 130 may be cooled to or sustained at a particular desired temperature that is a temperature (or close to a temperature) of the cleaning solution 135.

As shown, the solar panel cleaning system of the solar power system 100 may also include a seal 140 mounted to the top of the reservoir 130. The seal 140 may be a cover for the reservoir 130, for example, to prevent loss (for example, due to evaporation, spillage, or otherwise) of the cleaning solution 135 from the reservoir 130. The seal 140, in some aspects, may also contact the PV cells 110 to prevent leakage of the cleaning solution 135 from the reservoir 130 (for example, due to tipping of the solar power system 100). Other seals, such as magnetic fluid seals, are also contemplated by the present disclosure and are explained with reference to FIGS. 8A-8B.

The example embodiment of the solar power system 100 shown in FIG. 1B also includes a fill conduit 145 and a drain 145 that are fluidly coupled to the reservoir 130. For example, a volume of the cleaning solution 135 may be replenished from a cleaning solution source 160 (for example, tank, bottle, or other liquid holding device) through the fill conduit 145. In some cases, for example, the cleaning solution source 160 may also include, for example, a float valve and a pump that operate to circulate cleaning solution 135 to the reservoir 130 through the fill conduit 145 when the float valve determines that a volume of the solution 135 in the reservoir 130 is below a predetermined or desired minimum volume.

The drain 150 may be fluidly coupled to the reservoir 130 to a solution recapture system 165. In some aspects, because the used cleaning solution 135 within the reservoir 130 may contain dissolved particles, dust, or other contaminants, a filter 155 may be provided in the drain 150. The drain 150 may be opened (for example, by a valve or other orifice control device) manually or automatically to circulate used cleaning solution 135 from the reservoir 130 to the solution recapture system 165. Subsequently, the solution recapture system 165 may recycle (for example, further clean) the used cleaning solution 135 and supply the recycled solution to the cleaning solution source 160, or may include a tank or other enclosure to store used cleaning solution that is to be disposed.

In an example operation of the solar power system 100 shown in FIG. 1B, the solar panel 105 may operate to generate electricity in a normal operation mode. At a particular time, a determination may be made to clean the portion of PV cells 110 that are exposed to an ambient environment (for example, the cells 110 on the upper hemisphere 215), such as at a particular predetermined time interval, upon visual inspection of the exposed PV cells 110, or when a determined density of particles on the exposed PV cells 110 exceeds a threshold value. The actuator 117 may be operated (for example, manually or automatically) to rotate the spherical frame 120 about the axis 210. Upon rotation, the exposed PV cells 210 may be immersed into the cleaning solution 135 that is contained in the reservoir 130. The immersed PV cells 110 may remain in the solution 135 for a particular time duration (for example, determined based on an amount of time necessary to remove particles from the cells 110).

In some aspects, during cleaning of a portion of the PV cells 110 mounted on the solar panel 105, another portion of PV cells 110 (for example, mounted on the lower hemisphere 220) may continue electricity production for the solar power system 100, as rotation of the spherical frame 120 exposes the other portion of the PV cells 110 to the ambient environment. After the particular time duration expires, the actuator 117 may rotate the spherical frame 120 to move the cleaned (and cooled) PV cells 110 into exposure to the ambient environment. Intermittently or periodically, the cleaning solution 135 in the reservoir 130 may be replenished by circulating new solution 135 from the cleaning solution source 160, through the fill conduit 145, and into the reservoir 130. Also, intermittently or periodically, used cleaning solution 135 that contains, for example, dissolved particulates, may be circulated from the reservoir 130 and through the filter 155 to the drain 150. The filtered solution 135 may be circulated to the solution recapture system 165 for recycling or disposal.

Figure 2:
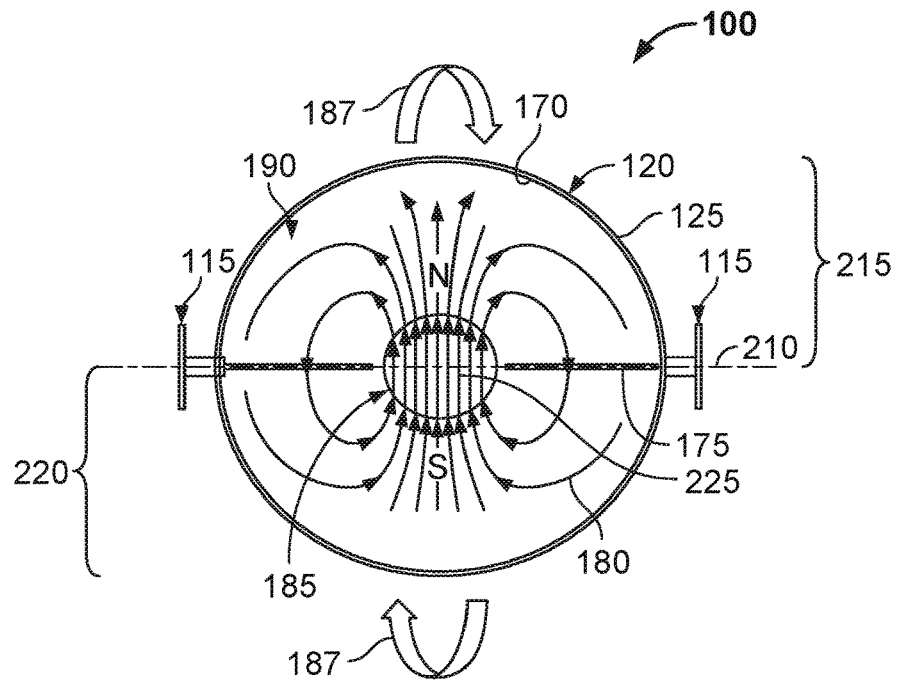
FIG. 2 is a schematic illustration of an internal sectional view of at least a portion of a solar power system that includes at least one magnet and a magnetized fluid to cool the solar power system.

FIG. 2 is a schematic illustration of an internal sectional view of at least a portion of the solar power system 100 that includes at least one magnet 185 and a magnetized fluid 180 to cool the solar power system 100. FIG. 2, as shown, illustrates a side-sectional view of the solar power system 100 taken through a diameter of the spherical frame 120. Generally, FIG. 2 shows an example embodiment of a solar power system cooling system that uses magnet 185 to circulate magnetized fluid 180 through an interior volume 190 of the spherical frame 120. By circulating the magnetized fluid 180 within the interior volume 190, heat from the PV cells 110 (not shown in this figure) may be transferred through the spherical frame 120 (for example, from the outer surface 125 to an inner surface 170) and into the magnetized fluid 180. Heat received into the magnetized fluid 180 may be transferred, for example, to a heat sink (described later), the cleaning solution 135, or other cooling source (for example, a cooling coil, Peltier cooler, or other cooling source in thermal communication with the magnetized fluid 180).

In some aspects, overheating (or heating) of solar power systems, such as the solar power system 100, may have deleterious effects on the operation of the system in producing electricity. For example, PV cell performance may decrease with increasing temperature, as operating temperature may affect the photovoltaic conversion process. Both the electrical efficiency and the power output of a PV cell decrease with increasing cell temperature. In desert applications, for instance, PV cells are often sensitive to overheating. For example, PV cells in the Middle East (for example, Dhahran, Saudi Arabia) may experience a loss of efficiency as operating temperature increases, as shown in chart 1000 in FIG. 10.

Figure 10:
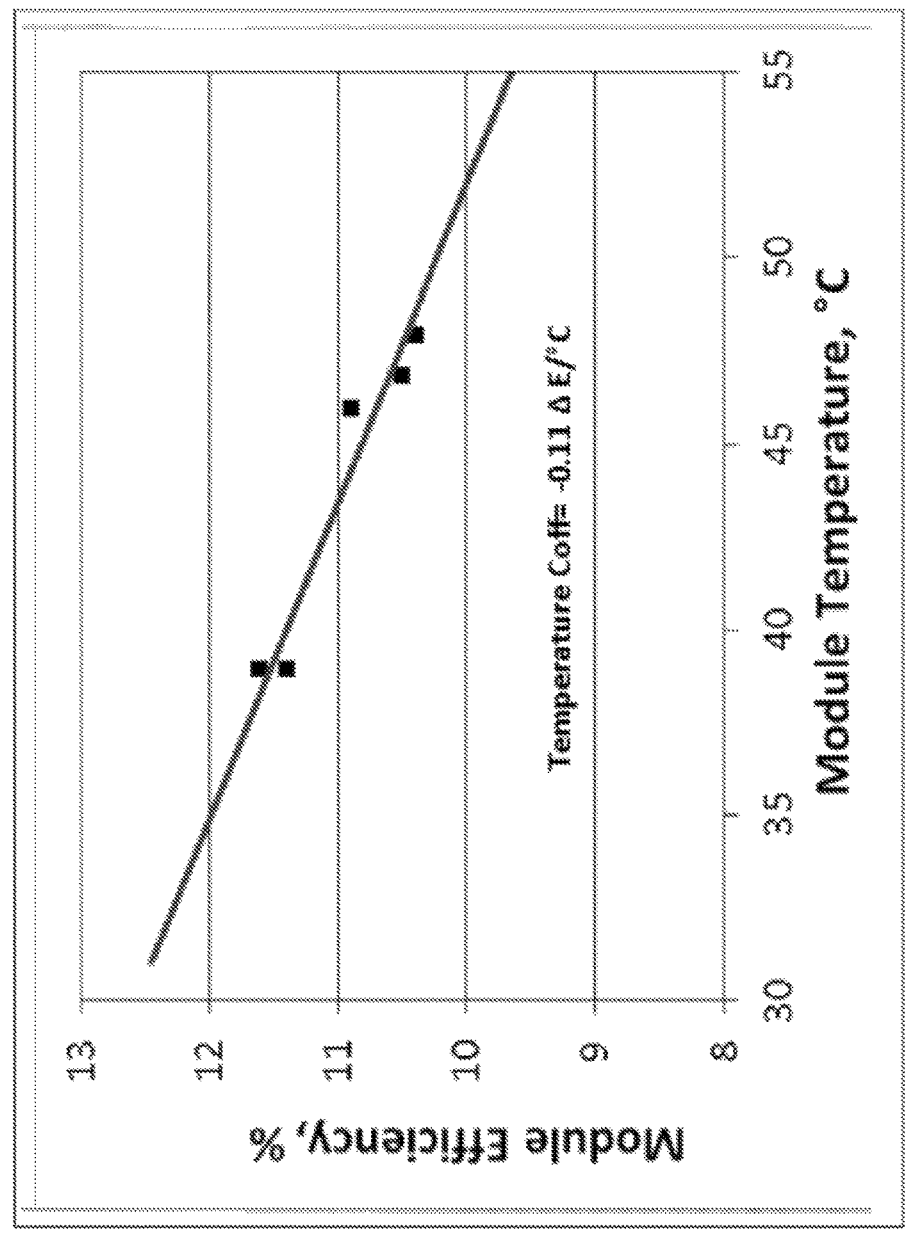
FIG. 10 is a chart that illustrates solar panel module efficiency as a function of module temperature.

As shown in chart 1000 of FIG. 10, PV cell efficiency can decrease from 11.6% to 10.4% when module temperature increases from 38° C. to 48° C., which corresponds to 10.3% losses in efficiency and a temperature coefficient of −0.11 ΔE/%° C. PV cell operating temperatures over 26° F. can begin reducing output efficiency, and as the temperature of a solar panel increases, the output current increases exponentially while the voltage output is reduced linearly. The cooling system illustrated in FIG. 2 can counter the efficiency loss of PV cells 110 in high temperature environments.

As shown, the magnetized fluid 180 is contained within the spherical frame 120 and free to circulate within the interior volume 190. Circulation of the magnetized fluid 180 may be at least partially generated by the magnet 185 mounted on shaft 175 that extends through the diameter of the spherical frame 120. In this example implementation, the magnet 185 is a spherically-shaped permanent magnet and generates a magnetic field 225 within the interior volume 190 of the spherical frame 120.

In some aspects, the magnetic fluid 180 is a ferrofluid (for example, liquid). Ferrofluids consist of a carrier fluid loaded with small (for example, nanometer sized) magnetic particles. The behavior of ferrofluids varies due to, for example, the carrier fluid, temperature, particle size, shape and loading, magnetic characteristics of the particles and the applied magnetic field (for example, magnetic field 225). When exposed to the magnetic field 225, the magnetized particles in the magnetized fluid 180 produce a body force. In addition, ferrofluid particle size ensures that thermal agitation in the fluid keeps the particles in suspension. Ferrofluids may be expected to perform at temperature of 150° C. (for example, continuously) or 200° C. (for example, intermittently).

As shown in FIG. 2, circulation curves represent the circulatory movement of the magnetized fluid 180 that is due, at least in part, to the magnetic field 225 (directed to cause the illustrated rotation) generated by the spherical magnet 185. As heat is being transferred to the magnetized fluid 180 during circulation (for example, heat from the PV cells 110), the system acts as a ferrofluid, or magneto-caloric, pump. For example, with reference briefly to FIG. 4, a magneto-caloric pump is a device which moves magnetic substances (the magnetized fluid 180) from a region of low pressure to a region of high pressure created by a heat source (the PV cells 110 that transfer heat into the interior volume 190 of the spherical frame 120).

Figure 4:
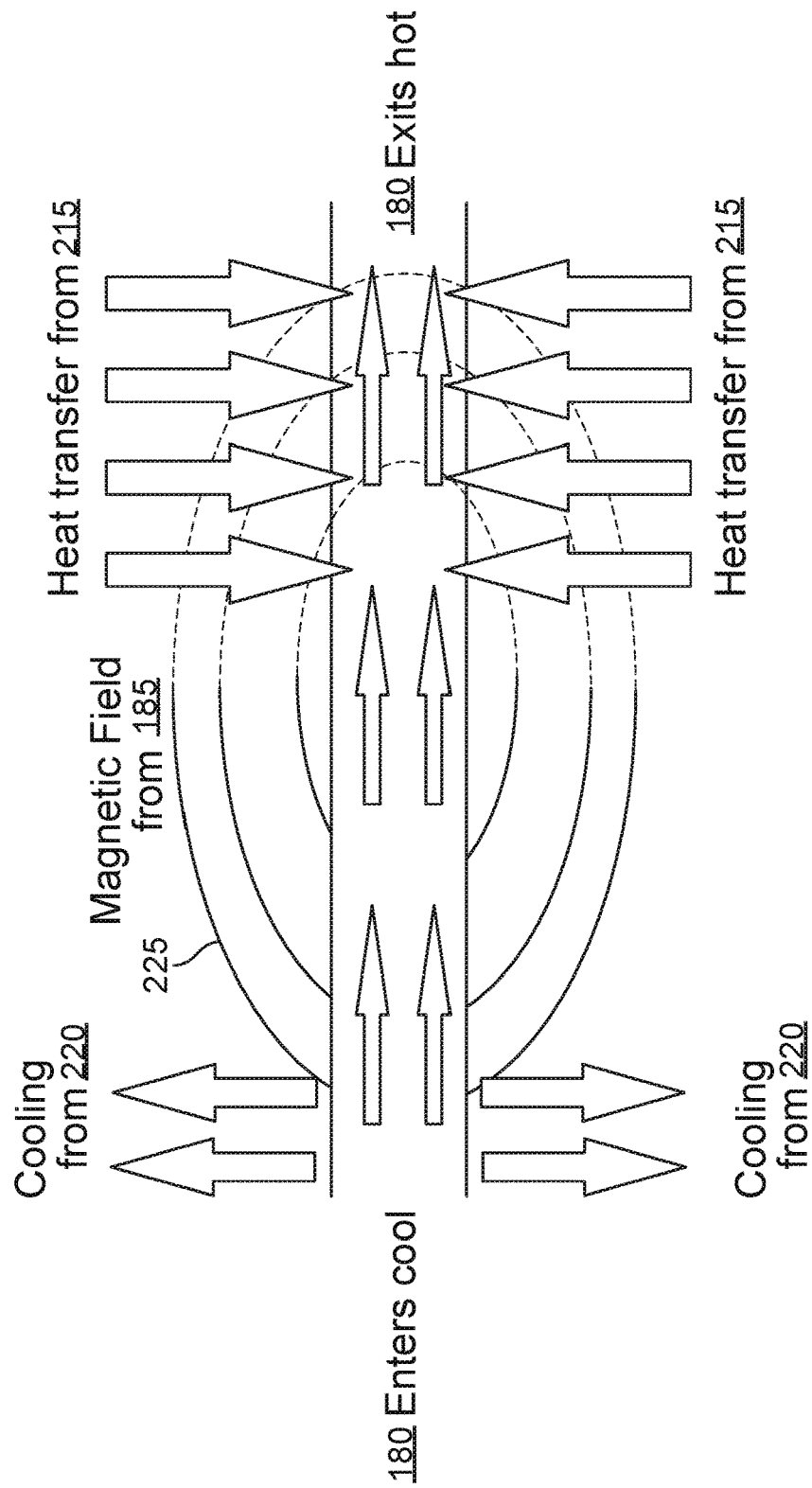
FIG. 4 is a schematic illustration of an example operation of a magnetic fluid pump.

FIG. 4 shows a generic schematic illustration of the operation of a magneto-caloric pump applied to the solar power system 100, which represents an example operation of the described cooling system of the solar power system 100 shown in FIG. 2. The "pump," in this case, refers to a flowpath of forced circulation due to the magnetic field 225 and a pressure differential caused by heating of the magnetized fluid 180 within the interior volume 190. The pump contains a magnetic field (field 225) and a heat source (heat from the PV cells 110). Under the influence of the magnetic field 225, magnetized fluid 180 is drawn into the pump. As it proceeds along the pump, the fluid 180 is heated by the heat source until the temperature of the magnetized fluid 180 reaches a point where there is a significant reduction in the ferromagnetic properties of the material (for example, the nanoparticles in the fluid). Generally, this happens when the material temperature approaches the "Curie Point" (for example, the temperature at which a material loses its permanent magnetic properties, to be replaced by induced magnetism).

The low temperature incoming magnetized fluid (for example, magnetized fluid 180 that flows through the lower hemisphere 220) is attracted by the magnetic field contained in the pump. The heated material (for example, heated magnetized fluid 180 flowing in the upper hemisphere 215) in the pump is no longer influenced by the magnetic field and is expelled from the pump by the incoming material (for example, cooler magnetized fluid 180 flowing upward from the lower hemisphere 220 to the upper hemisphere 215). A pressure head is created in the pump. The hot material (for example, magnetized fluid 180 from the upper hemisphere 215) from the pump is dissipated and returned to the pump input (for example, volume of the spherical frame 120 within the lower hemisphere 220), completing the pumping cycle.

Figure 3:
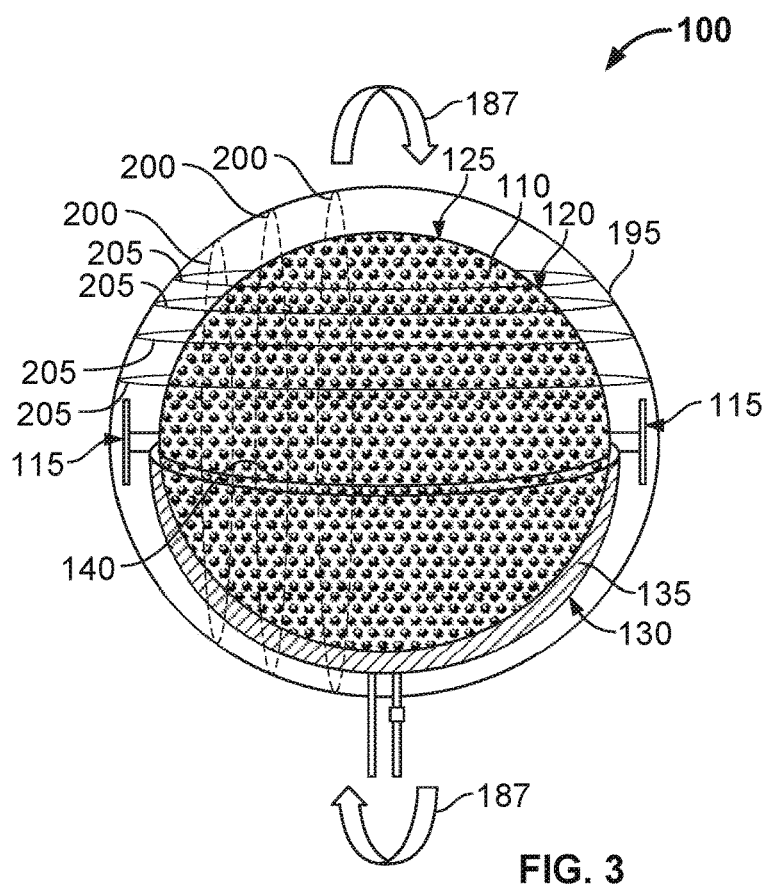
FIG. 3 is a schematic illustration of at least a portion of another solar power system that includes at least one magnet and a magnetized fluid to cool the solar power system, along with a solar panel cleaning assembly.

FIG. 3 is a schematic illustration of at least a portion of another embodiment of the solar power system 100 that includes at least one magnet 205 to circulate a magnetized fluid to cool the solar power system 100. FIG. 3 also shows the components of the solar panel cleaning assembly described previously with reference to FIG. 1B. FIG. 3 shows a side-view of this example of the solar power system 100. In this example embodiment, in addition to, or alternatively to, a spherical permanent magnet 185 mounted within the interior volume 190 of the spherical frame 120 (not shown in this figure, but shown in FIG. 2), one or more permanent ring magnets 205 may be mounted circumferentially adjacent the outer surface 125 of the spherical frame 120.

As shown, the permanent ring magnets 205 may be mounted to a cage ring 195 that is a circular structure that circumferentially surrounds the spherical frame 120. The permanent ring magnets 205 can also be mounted, as shown, to one or more cages 200 that are also mounted to the cage ring 195 circumferentially around the spherical frame 120. As illustrated, the cages 200 are mounted such that a diameter of each cage 200 is orthogonal to a diameter of the cage ring 195.

The operation of the embodiment of the solar power system 100 shown in FIG. 3 is similar to the operation of the solar power system 100 shown in FIG. 2, with the difference being that the magnetic field within the interior volume 190 of the spherical frame 120 is generated by the permanent ring magnets 205 rather than, or in addition to, a permanent magnet mounted within the interior volume 190 (for example, magnet 185). Thus, the permanent ring magnets 205 may generate the magnetic field that at least partially powers the magneto-caloric pump applied to the solar power system 100 as described previously.

As further shown in FIGS. 2 and 3, the spherical frame 120 may also be rotated (shown by rotations 187) by operation of the magneto-caloric pump described above. For example, ferrofluid migration (for example, movement of the magnetized fluid 180 within the volume 190) from cool to warm portions of the volume 190 may create a pressure differential sufficient to rotate the spherical frame 120 on the shaft 175. In some aspects, as shown and discussed later with reference to FIGS. 9A-9B, the rotation can be realized or enhanced through a balanced spherical frame 120 (for example, on the shaft 175) and the flow of the magnetized fluid 180 through flow channels formed by baffles mounted on the inner surface 170 of the spherical frame 120.

For instance, as the magnetized fluid 180 circulates within the interior volume 190 as shown, a rotational force may be exerted on the interior surface 170 of the spherical frame 120 by the moving fluid 180. This rotational force may cause the spherical frame 120 (if free to rotate on the shaft 175) to rotate as well about the axis 210. In some aspects, such rotation of the frame 120 may be desirable, for example, for automatic cleaning of the PV cells 110 by periodically rotating the solar panel 105 through the cleaning solution 135 (shown in FIGS. 1B and 3). In some aspects, the rotational speed of the spherical frame 120 may be based at least partially on a temperature gradient between the heated material (for example, magnetized fluid 180 within the upper hemisphere 215) and the cooled material (for example, magnetized fluid 180 within the lower hemisphere 220).

Figure 6:
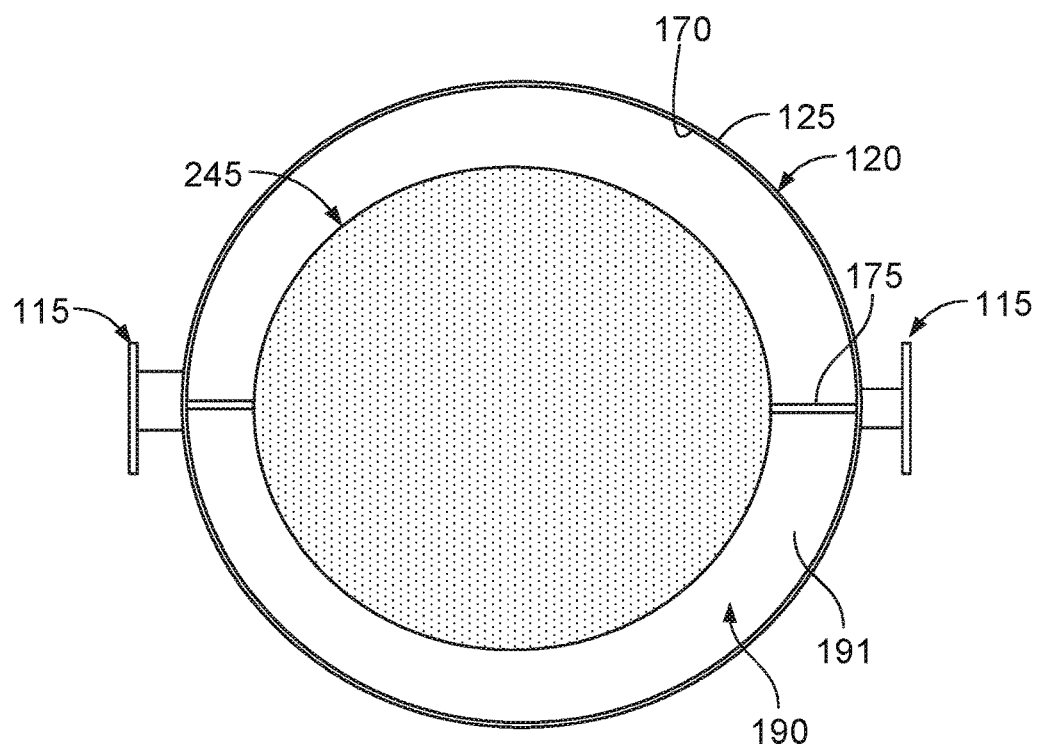
FIG. 6 is a schematic illustration of at least a portion of a solar power system that includes an inner spherical housing.

FIG. 6 is a schematic illustration of at least a portion of the solar power system 100 that includes an inner spherical housing 245. FIG. 2, as shown, illustrates a side-sectional view of the solar power system 100 taken through a diameter of the spherical frame 120 and the inner spherical housing 245. The inner spherical housing 245 is mounted on the shaft 175 and defines an additional interior volume of the interior volume 190 of the spherical frame 120. An annulus 191 is further defined between the inner surface 170 of the spherical frame 120 and the inner spherical housing 245.

Figure 7:
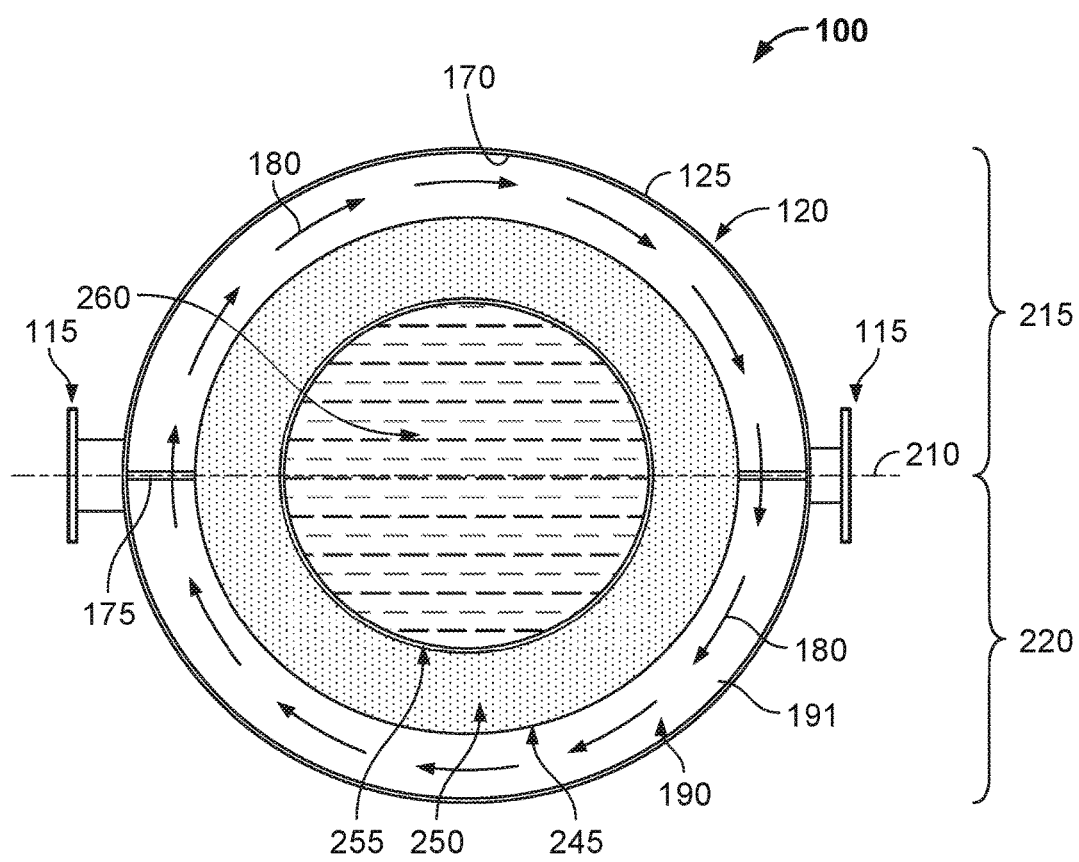
FIG. 7 is a schematic illustration of at least a portion of a solar power system that includes at least one magnet mounted in an inner spherical housing and a magnetized fluid to cool the solar power system, along with a phase change heat transfer material.

Generally, the inner spherical housing 245 provides an enclosure for, as some examples, one or more permanent magnets (such as magnet 185) mounted on the shaft 175, a heat sink (as described later), or to enclose other components of the solar power system 100. For example, FIG. 7 is a schematic illustration of at least a portion of the solar power system 100 that includes at least one magnet 250 mounted in the inner spherical housing 245, along with a heat transfer material 260 that is disposed within a volume encompassed by the magnet 250. In this implementation, the inner spherical housing 245 is separate from the spherical (permanent) magnet 250, which is mounted within the volume of the housing 245. In alternative implementations, the spherical magnet 250 may form a housing that defines the volume into which the heat transfer material 260 is disposed.

The spherical magnet 250 may be mounted on the shaft 175 and generates a magnetic field (not shown here) much like the magnetic field 225 is generated by spherical magnet 185 in FIG. 2. Thus, the spherical magnet 250 may generate a magnetic field within the interior volume 190 of the spherical frame 120 that at least partially powers the magneto-caloric pump applied to the solar power system 100 as described previously. In this example, therefore, the spherical magnet 250 generates the magnetic field that drives (along with a temperature gradient) the magnetized fluid 180 within the interior volume 190 and in the annulus 191.

The inner volume of the inner spherical housing 245 may include or define a heat sink (for example, in embodiments with or without the spherical magnet 250). The hint sink includes the heat transfer material 260. For example, the heat sink within the housing 245 may provide for a central volume available for absorbance of thermal energy, for example, from the PV cells 110. This central volume can be used in the form of various heat exchange technologies including chemical absorption through the melting of calcium hydroxide ($Ca(OH)_2$) crystals in a aqueous solution or through the use of a tunable phase change material (PCM). Either material, as well as other examples, can be used as the heat transfer material 260. Further, an amount of material may be adjusted (and adjustable) based on the formulation of heat transfer material included within the heat sink and by adjusting the size of the inner spherical housing 245, spherical frame 120, solar panel 105, or a combination thereof, to provide a desired heat transfer amount. Further, in some aspects, the heat transfer material 260 can absorb thermal energy from the PV cells 110 during a daylight operation time of the solar power system 100 and phase change from solid to liquid by absorbing the thermal energy. The heat transfer material 260 can then solidify during a nighttime non-operational time (for example, when no or negligible solar energy is incident on the solar power system 100) as ambient temperature surrounding the solar power system 100 decreases.

In some aspects, the heat transfer material 260 is a PCM such as one or more paraffin waxes. For example, paraffin wax is typically found as a white, odorless, tasteless, waxy solid, with a typical melting point between about 46° C. and 68° C. (115° F. and 154° F.). Some paraffin products have melting temperatures of 270° F. In some aspects, the heat transfer material 260 may be a blend of paraffin waxes with different melting points to more evenly and slowly change phase from solid to liquid as thermal energy is absorbed. For example, a combination and quantity of low, middle, and high temperature compositions may be formulated based on the amount of heat required for removal from the PV cells 110. In some cases, the melting point of a paraffin wax can be depressed using mixtures of high long chained organic acids and salt solutions. Table 1 shows example commercial paraffin waxes from International Group Inc. that could be used, individually or in combination, as the heat transfer material 260.

TABLE 1

Astorstat ®

| Product | Congealing Point (ASTM D938) | Start to Open Point (Astor ® DST-007) | Terminal Point (Astor DST-007) | Volume of Expansion (Astor DST-007) | Travel (Astor DST-007) |
|---|---|---|---|---|---|
| Low Operating Temperature Range | | | | | |
| Astorstat HA16 | 17.8-18.9° C. 64-66° F. | 17.8-18.9° C. 64-66° F. | 23.4-24.5° C. 74-76° F. | 14-18% | 5.88-6.89 mm 0.23-0.27 in |
| Astorstat HA18 | 27.2-28.3° C. 81-83° F. | 27.2-28.3° C. 81-83° F. | 32.8-33.9° C. 91-93° F. | 14-18% | 5.88-6.89 mm 0.23-0.27 in |
| Astorstat HA20 | 36.7-37.8° C. 98-100° F. | 36.7-37.8° C. 98-100° F. | 42.3-43.4° C. 108-110° F. | 16-20% | 6.37-7.41 mm 0.25-0.29 in |
| Astorstat HA300B | 41-42.5° C. 106-108.5° F. | 26-28° C. 78.8-82.5° F. | 46-48° C. 115-118.5° F. | 9-13% | 4.85-5.62 mm 0.19-0.20 in |
| Mid Operating Temperature Range | | | | | |
| Astorstat 75 | 80.1-81.2° C. 176-178° F. | 74.5-75.6° C. 166-168° F. | 85.6-86.7° C. 186-188° F. | 14-16% | 5.88-6.37 mm 0.23-0.25 in |
| Astorstat 80 | 85.1-86.2° C. 185-187° F. | 79.5-80.5° C. 175-177° F. | 90.6-91.7° C. 195-197° F. | 14-16% | 5.88-6.37 mm 0.23-0.25 in |
| Astorstat 90 | 95.1-96.2° C. 203-205° F. | 89.5-90.6° C. 193-195° F. | 100.6-101.7° C. 213-215° F. | 14-16% | 5.88-6.37 mm 0.23-0.25 in |
| Astorstat 95 | 100-101.2° C. 212-214° F. | 89.0-90.1° C. 192-194° F. | 105.6-106.8° C. 222-224° F. | 14-16% | 5.88-6.37 mm 0.23-0.25 in |
| High Operating Temperature Range | | | | | |
| Astorstat 6920 | 124-129.5° C. 255-265° F. | 107.3-112.9° C. 225-235° F. | 126.8-132.3° C. 260-270° F. | 16-18% | 6.37-6.89 mm 0.25-0.27 in |
| Astorstat 6988 | 130-135° C. 265-275° F. | 115.6-121.2° C. 240-250° F. | 129.5-135.1° C. 265-275° F. | 16-18% | 6.37-6.89 mm 0.25-0.27 in |
| Astorstat 10069 | 105-106° C. 221-223° F. | 98.4-100.0° C. 209-212° F. | 114.5-116.2° C. 238-241° F. | 14-16% | 5.88-6.37 mm 0.23-0.25 in |
| Astorstat 10316 | 109-110.6° C. 228-231° F. | 104-105.6° C. 219-222° F. | 125.7-127.9° C. 258-262° F. | 15-17% | 6.13-6.63 mm 0.24-0.26 in |

FIG. 8A is a schematic illustration of at least a portion of the solar power system 100 that includes at least one toroidal magnet 265 and the magnetized fluid 180 to cool the solar power system 100. FIG. 8A, as shown, illustrates a side-sectional view of the solar power system 100 taken through a diameter of the spherical frame 120. Generally, FIG. 8A shows an example embodiment of a solar power system cooling system that uses the toroidal magnet 265 to generate a magnetic field 270 to circulate the magnetized fluid 180 through the interior volume 190 of the spherical frame 120. By circulating the magnetized fluid 180 within the interior volume 190, heat from the PV cells 110 (not shown in this figure) may be transferred through the spherical frame 120 (for example, from the outer surface 125 to an inner surface 170) and into the magnetized fluid 180. Heat received into the magnetized fluid 180 may be transferred, for example, to a heat sink (described previously), the cleaning solution 135, or other cooling source (for example, a cooling coil, Peltier cooler, or other cooling source in thermal communication with the magnetized fluid 180). As shown, the magnetized fluid 180 is contained within the spherical frame 120 and free to circulate within the interior volume 190. Circulation of the magnetized fluid 180 may be at least partially generated by the magnet 265 mounted on shaft 175 that extends through the diameter of the spherical frame 120.

FIG. 8B is a schematic illustration of a magnetic fluid seal system that may be implemented with the solar power system 100 that includes a solar panel cleaning assembly. For example, as illustrated FIG. 8A includes the solar panel cleaning assembly which includes the reservoir 130 hemispherically positioned around the lower hemisphere 220 of the spherical frame 120. The reservoir 130 holds the cleaning solution 130. The magnetic fluid seal system, in this example implementation, comprises a ferrofluid seal that uses a magnetized fluid to create a seal so that a liquid (for example, the cleaning solution 135) does not escape a container (for example, the reservoir 130). As illustrated, the magnetic fluid seal system includes a magnet 275 mounted between the reservoir 130 and the outer surface 125 of the spherical frame 120. The magnet 275 includes pole pieces 280 and generate a magnetic flux 285. The magnetic flux 285 travels through a ring of magnetic fluid 290 to energize the particles within the fluid 290. The magnetic fluid 290, which is held against the outer surface 125 of the spherical frame 120 and the pole piece 280 by the flux 285, creates a fluidic seal to prevent or help prevent the cleaning solution 135 from escaping the reservoir 130.

Figure 9A:
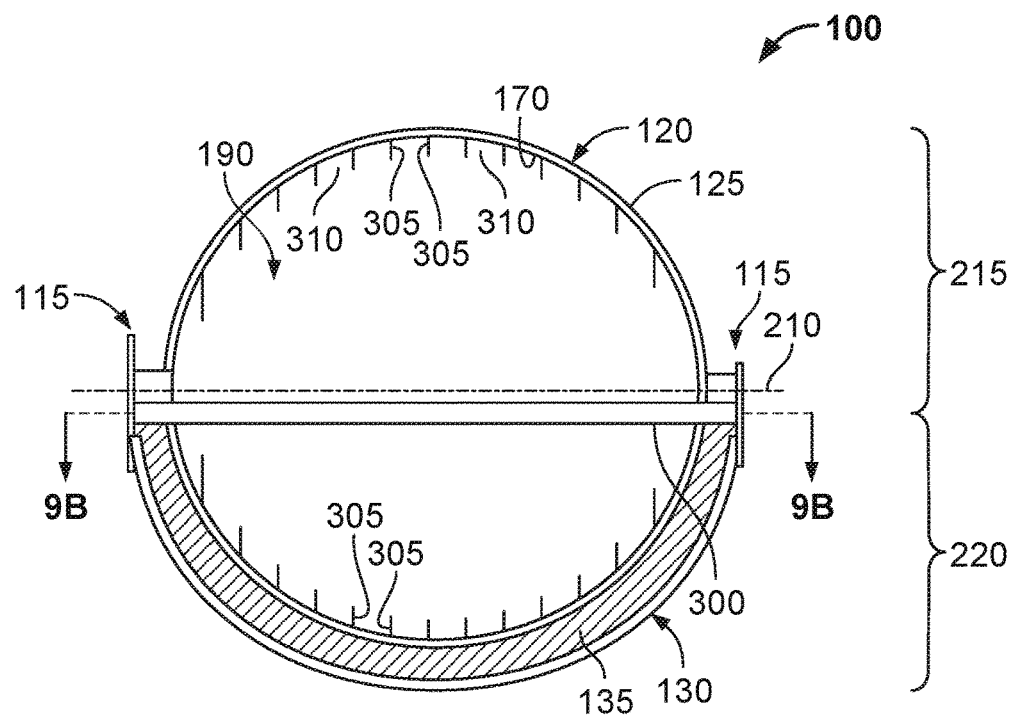
FIGS. 9A-9B are schematic illustrations of at least a portion of another solar power system that includes at least one ring magnet and a magnetized fluid to cool the solar power system, along with a solar panel cleaning assembly.
Figure 9B:
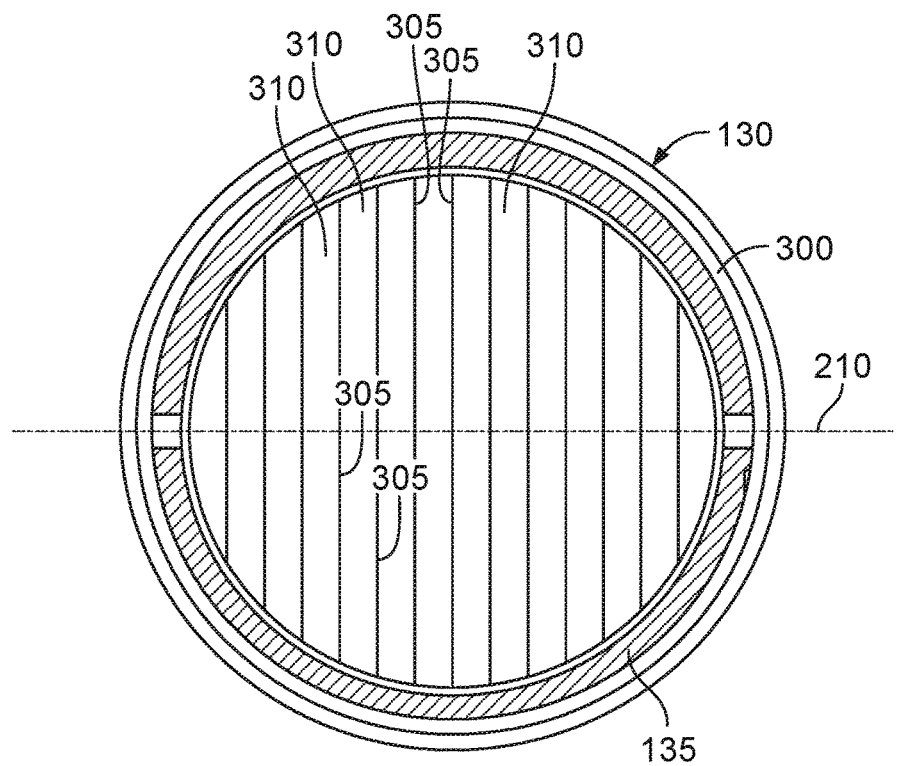

FIGS. 9A-9B are schematic illustrations of at least a portion of another embodiment of the solar power system 100 that includes at least one ring magnet 300 the solar panel cleaning assembly. FIG. 9A, as shown, illustrates a side-sectional view of the solar power system 100 taken through a diameter of the spherical frame 120. FIG. 9B, as shown, illustrates a top-sectional view of the solar power system 100 taken through the ring magnet 300. Generally, FIGS. 9A-9B show an example embodiment of a solar power system cooling system that uses the ring magnet 300 (for example, mounted circumferentially around the spherical frame 120 at the axis 210) to generate a magnetic field to circulate a magnetized fluid (not shown in this figure) through the interior volume 190 of the spherical frame 120. By circulating the magnetized fluid within the interior volume 190, heat from the PV cells 110 (not shown in this figure) may be transferred through the spherical frame 120 (for example, from the outer surface 125 to an inner surface 170) and into the magnetized fluid 180. Heat received into the magnetized fluid may be transferred, for example, to a heat sink (described previously), the cleaning solution 135, or other cooling source (for example, a cooling coil, Peltier cooler, or other cooling source in thermal communication with the magnetized fluid 180).

FIGS. 9A-9B also show an example embodiment of the spherical frame 120 that includes one or more baffles 305 formed (for example, attached to or integral with) the inner surface 170 of the frame 120. The baffles 305 form flow paths 310 through which the magnetized fluid flows during circulation of the fluid through the interior volume 190. For example, as previously described, ferrofluid migration (for example, movement of the magnetized fluid within the volume 190) from cool to warm portions of the volume 190 may create a pressure differential sufficient to rotate the spherical frame 120 on a shaft (for example, shaft 175, not shown in these figures). In some aspects, the rotation can be realized or enhanced through a balanced spherical frame 120 (for example, on the shaft) and the flow of the magnetized fluid through flow channels formed by baffles 305 mounted on the inner surface 170 of the spherical frame 120. For instance, as the magnetized fluid circulates within the interior volume 190 as shown, a rotational force may be exerted on the interior surface 170 of the spherical frame 120 by the moving fluid. This rotational force may cause the spherical frame 120 (if free to rotate on the shaft) to rotate as well about the axis 210. In some aspects, such rotation of the frame 120 may be desirable, for example, for automatic cleaning of the PV cells 110 by periodically rotating the solar panel 105 through the cleaning solution 135. In some aspects, the rotational speed of the spherical frame 120 may be based at least partially on a temperature gradient between the heated material (for example, magnetized fluid within the upper hemisphere 215) and the cooled material (for example, magnetized fluid within the lower hemisphere 220).

While this disclosure contains many specifics, these should not be construed as limitations on the scope of the disclosure or of what may be claimed, but rather as descriptions of features specific to particular implementations of the disclosure. Certain features that are described in this disclosure in the context of separate implementations can also be provided in combination in a single implementation. Conversely, various features that are described in the context of a single implementation can also be provided in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the present disclosure have been described. Other implementation s are within the scope of the following claims. For example, the actions recited in the claims can be performed in a different order and still achieve desirable results.

What is claimed is:

1. A solar power system, comprising:
a plurality of solar power cells mounted on a spherical frame;
a hemispherical reservoir mounted to the spherical frame to enclose at least a portion of the spherical frame such that a gap is defined between the spherical frame and an interior surface of the reservoir, the reservoir configured to hold a fluid that comprises a solar cell cleaning solution, wherein the plurality of solar power cells are mounted on an upper hemispherical portion of the spherical frame, and the hemispherical reservoir is mounted to the spherical frame to enclose a lower hemispherical portion of the spherical frame, and another plurality of solar power cells is mounted to the lower hemispherical portion of the spherical frame; and
at least one actuator mounted to the spherical frame and operable to rotate a portion of the spherical frame that supports the plurality of solar power cells through the gap.

2. The solar power system of claim 1, wherein the plurality of solar power cells comprise a plurality of photovoltaic (PV) cells.

3. The solar power system of claim 1, wherein the at least one actuator comprises at least one motor mounted to the spherical frame.

4. The solar power system of claim 1, wherein the actuator is mounted to the spherical frame at an axis of rotation of the spherical frame that extends through a geometric center of the spherical frame.

5. The solar power system of claim 1, further comprising:
an input conduit fluidly coupled between the reservoir and a source of the solar cell cleaning solution; and
an output conduit fluidly coupled between the reservoir and a solar cell cleaning solution waste tank.

6. The solar power system of claim 5, wherein the output conduit comprises a filter.

7. The solar power system of claim 1, further comprising a seal mounted to at least one of the spherical frame or the reservoir and positioned in fluidly-sealing contact with a top surface of the reservoir and at least a portion of the plurality of solar power cells.

8. The solar power system of claim 7, wherein the seal comprises a flexible ring mounted along a circumference of the top surface of the reservoir.

9. The solar power system of claim 2, wherein the at least one actuator comprises at least one motor mounted to the spherical frame, and the actuator is mounted to the spherical frame at an axis of rotation of the spherical frame that extends through a geometric center of the spherical frame, the system further comprising:
an input conduit fluidly coupled between the reservoir and a source of the solar cell cleaning solution; and
an output conduit fluidly coupled between the reservoir and a solar cell cleaning solution waste tank, the output conduit comprising a filter.

10. The solar power system of claim 9, further comprising a seal mounted to at least one of the spherical frame or the reservoir and positioned in fluidly-sealing contact with a top surface of the reservoir and at least a portion of the plurality of solar power cells, the seal comprising a flexible ring mounted along a circumference of the top surface of the reservoir.

11. A solar power system, comprising:
a plurality of solar power cells mounted on a spherical frame;
a hemispherical reservoir mounted to the spherical frame to enclose at least a portion of the spherical frame such that a gap is defined between the spherical frame and an interior surface of the reservoir, the reservoir configured to hold a fluid that comprises a solar cell cleaning solution;
at least one actuator mounted to the spherical frame and operable to rotate a portion of the spherical frame that supports the plurality of solar power cells through the gap;
an input conduit fluidly coupled between the reservoir and a source of the solar cell cleaning solution; and
an output conduit fluidly coupled between the reservoir and a solar cell cleaning solution waste tank.

12. The solar power system of claim 9, wherein the plurality of solar power cells comprise a plurality of photovoltaic (PV) cells.

13. The solar power system of claim 9, wherein the at least one actuator comprises at least one motor mounted to the spherical frame.

14. The solar power system of claim 9, wherein the actuator is mounted to the spherical frame at an axis of rotation of the spherical frame that extends through a geometric center of the spherical frame.

15. The solar power system of claim 9, wherein the plurality of solar power cells is mounted on an upper hemispherical portion of the spherical frame, and the hemispherical reservoir is mounted to the spherical frame to enclose a lower hemispherical portion of the spherical frame.

16. The solar power system of claim 13, further comprising another plurality of solar power cells mounted to the lower hemispherical portion of the spherical frame.

17. The solar power system of claim 9, wherein the output conduit comprises a filter.

18. The solar power system of claim 9, further comprising a seal mounted to at least one of the spherical frame or the reservoir and positioned in fluidly-sealing contact with a top surface of the reservoir and at least a portion of the plurality of solar power cells.

19. The solar power system of claim 16, wherein the seal comprises a flexible ring mounted along a circumference of the top surface of the reservoir.

20. The solar power system of claim 10, wherein the at least one actuator comprises at least one motor mounted to the spherical frame, and the actuator is mounted to the spherical frame at an axis of rotation of the spherical frame that extends through a geometric center of the spherical frame, and the plurality of solar power cells comprise a first portion of solar power cells and a second portion of solar power cells, the first portion of solar power cells mounted on an upper hemispherical portion of the spherical frame, and the hemispherical reservoir is mounted to the spherical frame to enclose a lower hemispherical portion of the spherical frame, and the second portion of solar power cells is mounted to the lower hemispherical portion of the spherical frame.

21. The solar power system of claim 18, further comprising a seal mounted to at least one of the spherical frame or the reservoir and positioned in fluidly-sealing contact with a top surface of the reservoir and at least a portion of the plurality of solar power cells, and the seal comprises a flexible ring mounted along a circumference of the top surface of the reservoir.

* * * * *